(12) United States Patent
Kim et al.

(10) Patent No.: US 10,819,935 B2
(45) Date of Patent: Oct. 27, 2020

(54) RAMP SIGNAL GENERATOR AND CMOS IMAGE SENSOR USING THE SAME

(71) Applicant: SK hynix Inc., Gyeonggi-do (KR)

(72) Inventors: Hyeon-June Kim, Jeollanam-do (KR); Hoe-Sam Jeong, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,830

(22) Filed: Dec. 13, 2018

(65) Prior Publication Data

US 2019/0335126 A1 Oct. 31, 2019

(51) Int. Cl.
*H04N 5/378* (2011.01)
*H01L 27/146* (2006.01)
*H04N 5/3745* (2011.01)
*H04N 9/04* (2006.01)

(52) U.S. Cl.
CPC ....... *H04N 5/378* (2013.01); *H01L 27/14645* (2013.01); *H04N 5/37455* (2013.01); *H04N 9/045* (2013.01)

(58) Field of Classification Search
CPC .......... H01L 27/14645; H04N 5/37455; H04N 5/378; H04N 9/045; H03M 1/56
See application file for complete search history.

(56) References Cited

U.S. PATENT DOCUMENTS

| | | | | |
|---|---|---|---|---|
| 6,956,413 B2* | 10/2005 | Bailey | ................ | H03K 4/026 327/131 |
| 8,093,543 B2* | 1/2012 | Yamaoka | ............ | H03K 4/026 250/214 R |
| 9,036,041 B2* | 5/2015 | Nam | ..................... | H03K 4/02 327/126 |
| 9,686,494 B2* | 6/2017 | Aibara | ................ | H04N 5/378 |
| 9,986,172 B2* | 5/2018 | Aibara | ................ | H04N 5/2357 |
| 2003/0071748 A1* | 4/2003 | Huang | ............ | H03M 1/0845 341/155 |
| 2007/0080838 A1* | 4/2007 | Asayama | ............ | H03M 1/66 341/144 |
| 2007/0194962 A1* | 8/2007 | Asayama | ............ | H03M 1/1014 341/144 |
| 2008/0043810 A1* | 2/2008 | Vogt | ..................... | G01K 1/02 374/170 |
| 2008/0211951 A1* | 9/2008 | Wakabayashi | ....... | H04N 5/3655 348/308 |
| 2010/0020217 A1* | 1/2010 | Abe | ..................... | H04N 5/3591 348/308 |

(Continued)

FOREIGN PATENT DOCUMENTS

| | | |
|---|---|---|
| KR | 10-2008-0034687 A | 4/2008 |
| KR | 10-2012-0002274 A | 9/2012 |
| WO | WO-2005069601 A1 * | 7/2005 ......... H04N 5/37455 |

*Primary Examiner* — Chiawei Chen
(74) *Attorney, Agent, or Firm* — Perkins Coie LLP

(57) ABSTRACT

Provided are devices having a ramp signal generator for adjusting a slope of a ramp signal by adjusting a current of a unit current circuit to adjust a step size. The ramp signal generator may include a unit current circuit including one or more current paths that allow a flow of an electrical current generated based on a ramp supply voltage, and a slope adjustment circuit configured to adjust a slope of a ramp signal by changing a current path of the electrical current flowing through the one or more current paths of the unit current circuit.

20 Claims, 10 Drawing Sheets

(56) References Cited

U.S. PATENT DOCUMENTS

| | | | |
|---|---|---|---|
| 2011/0114827 A1* | 5/2011 | Yamaoka | H03K 4/026 250/214 R |
| 2011/0169990 A1* | 7/2011 | Higuchi | H03K 4/48 348/302 |
| 2013/0087688 A1* | 4/2013 | Saito | H03K 3/0231 250/208.1 |
| 2016/0044261 A1* | 2/2016 | Hagihara | H03M 1/12 348/295 |
| 2016/0315602 A1* | 10/2016 | Sohn | H04N 5/378 |
| 2016/0364598 A1* | 12/2016 | Chen | H03K 4/08 |
| 2017/0223284 A1* | 8/2017 | Song | H04N 5/37455 |
| 2020/0059240 A1* | 2/2020 | Moue | H03M 3/368 |

* cited by examiner

RAMP SIGNAL GENERATOR AND CMOS IMAGE SENSOR USING THE SAME

CROSS-REFERENCE TO RELATED PATENT DOCUMENTS

This patent document claims the priority and benefits of Korean Patent Application No. 10-2018-0049939 filed on Apr. 30, 2018, which is incorporated herein by reference in its entirety.

TECHNICAL FIELD

The technology and implementations disclosed in this patent document relate to an analog-to-digital conversion device and a complementary metal oxide semiconductor (CMOS) image sensor (CIS).

BACKGROUND

In general, an image sensing device includes pixels for capturing images using photodiodes (PD) that converts light into an electrical current and transfer it to a floating diffusion node, which is an input node (a gate terminal) of a conversion transistor (a source follower transistor), through a transfer transistor. The electric current transferred to the floating diffusion node may shift the voltage at an output terminal of the conversion transistor, and this output voltage is called a pixel signal.

For purposes of quality control of the image sensing device, exposure linearity tests are conducted to check linearity of an analog-to-digital conversion code while increasing the amount of light incident on the photodiode of the pixel.

The non-linearity occurs in the process of transferring the electrical current generated by the photodiode to the floating diffusion node.

Additionally, since a slope of a ramp signal (a ramp voltage) has linearity, a code error occurs in the process of finding a position of a pixel signal based on the ramp signal.

An acceptable error rate for a code error is typically around 1%, but those non-linearity issues may cause the code error range to exceed the acceptable error rate.

Where the non-linearity of the pixel signal is increased as the amplitude of the pixel signal is increased like a gain error, the code error range could exceed the acceptable error rate when the pixel signal has a high amplitude.

SUMMARY

This patent document provides, among others, designs of image sensing devices that have a ramp signal generator for adjusting a slope of a ramp signal by adjusting a current of a unit current circuit to adjust a step size, unlike another ramp signal generator in which a step size of a unit current circuit is fixed. This patent document also provides designs of image sensing devices that have a ramp signal generator that minimizes a code error by nonlinearly adjusting a slope of a ramp signal similarly to nonlinearity of a pixel signal.

In an embodiment of the disclosed technology, a device including a ramp signal generator which may comprise: a unit current circuit including one or more current paths that allow a flow of an electrical current generated based on a ramp supply voltage; and a slope adjustment circuit configured to adjust a slope of a ramp signal by changing a current path of the electrical current flowing through the one or more current paths of the unit current circuit.

The slope adjustment circuit may include a current feedback path that changes the flow of the electrical current from one current path to another current path to adjust the current flowing through the unit current circuit. The slope adjustment circuit may allow a current, which would have been wasted when the unit current circuit is turned off had the current feedback path not been formed, to be fed back to a ramp resistor through the current feedback path. The slope adjustment circuit may comprise: a first transistor configured to form a current path of wasting the current when the unit current circuit is turned off; and a second transistor configured to form the current feedback path of allowing the current to be fed back to the ramp resistor when the unit current circuit is turned off. The first transistor may have a source terminal electrically connected to the unit current circuit, and a drain terminal electrically connected to a ground voltage.

The second transistor may have a source terminal electrically connected to the unit current circuit, and a drain terminal electrically connected to the ramp resistor. The slope adjustment circuit may further comprise: a switch coupled to the second transistors to turn on or off the current feedback path. The switch may comprise: a third transistor provided between the unit current circuit and the source terminal of the second transistor. The slope adjustment circuit is provided in the unit current circuit.

In another embodiment of the disclosed technology, a device including a CMOS image sensor which may comprise: a pixel array configured to output pixel signals corresponding to incident light; a row decoder configured to select and control pixels in the pixel array according to row lines; a ramp signal generator including a plurality of unit current circuits, each unit current circuit being coupled to a current feedback path, the ramp signal generator being configured to adjust a current flowing through the unit current circuit by using the current feedback path to adjust a slope of a ramp signal; a comparison circuit configured to compare the ramp signal applied from the ramp signal generator with each pixel signal of the pixel array; a counting circuit configured to count the number of clock pulses according to each output signal of the comparison circuit; a memory circuit configured to store counting information of the counting unit including the number of clock pulses provided by the counting unit; a control circuit configured to control operations of the row decoder, the ramp signal generator, the comparison unit, the counting unit, and the memory unit; and a column readout circuit configured to output data stored in the memory unit according to instructions provided by the control unit.

The ramp signal generator may comprise: the unit current circuit including one or more current paths that allow a flow of an electrical current generated based on a ramp supply voltage; and a slope adjustment circuit configured to adjust a slope of a ramp signal by changing a current path of the electrical current flowing through the one or more current paths of the unit current circuit to the current feedback path. The slope adjustment circuit may allow a current, which would have been wasted when the unit current circuit is turned off had the current feedback path not been formed, to be fed back to a ramp resistor through the current feedback path to adjust the slope of the ramp signal. The slope adjustment circuit may comprise: a first transistor configured to form a current path of wasting the current when the unit current circuit is turned off; and a second transistor configured to form the current feedback path of allowing the current to be fed back to the ramp resistor when the unit current circuit is turned off. The first transistor may have a source terminal electrically connected to the unit current circuit, and a drain terminal electrically connected to a ground voltage. The second transistor may have a source terminal electrically connected to the unit current circuit, and a drain terminal electrically connected to the ramp resistor. The slope adjustment circuit may further comprise: a switch coupled to the second transistors to turn on or off the current feedback path. The switch may comprise: a third transistor provided between the unit current circuit and the source terminal of the second transistor. The slope adjustment circuit is provided in the unit current circuit.

In another embodiment of the disclosed technology, a device including a ramp signal generator which may comprise: a plurality of unit current circuits that sequentially reduces a number of the unit current circuits that allow an electrical current to flow from a voltage supply terminal of the ramp signal generator to a ramp resistor to generate a ramp signal, each unit current circuit including a first current path that may allow the electrical current to flow to the ramp resistor and a second current path that inhibits the electrical current from flowing to the ramp resistor; and a plurality of slope adjustment circuits, each slope adjustment circuit being coupled to each unit current circuit, each slope adjustment circuit including a third current path that may allow the electrical current to flow from the second current path to the ramp resistor to adjust a slope of the ramp signal by adjusting the electrical current flowing to the ramp resistor.

Each slope adjustment circuit further may include a switch coupled between the third current path and the ramp resistor to connect or disconnect the third current path to the ramp resistor.

In an embodiment of the disclosed technology, a ramp signal generator may include a unit current circuit through which a current based on a ramp supply voltage flows, and a slope adjustment block that adjusts a slope of a ramp signal by adjusting the current flowing through the unit current circuit.

In another embodiment of the disclosed technology, a CMOS image sensor may include a pixel array that outputs a pixel signal corresponding to incident light, a row decoder that selects and controls pixels in the pixel array according to row lines, a ramp signal generator that adjusts a current flowing through a unit current circuit by using a current feedback path, adjusts a slope of a ramp signal, and generates the ramp signal, a comparison unit that compares the ramp signal applied from the ramp signal generator and each pixel signal of the pixel array with each other, a counting unit that counts a clock according to each output signal of the comparison unit, a memory unit that stores counting information of the counting unit, a control unit that controls operations of the row decoder, the ramp signal generator, the comparison unit, the counting unit, and the memory unit, and a column readout circuit that outputs data of the memory unit under control of the control unit.

In another embodiment of the disclosed technology, unlike another ramp signal generator in which a step size of a unit current circuit is fixed, a current of a unit current circuit is adjusted to adjust a step size, so that it is possible to adjust a slope of a ramp signal.

Furthermore, in various embodiments of the disclosed technology, the slope of the ramp signal is nonlinearly adjusted similarly to non-linearity of a pixel signal, so that it is possible to minimize a code error.

DETAILED DESCRIPTION

Figure 1:
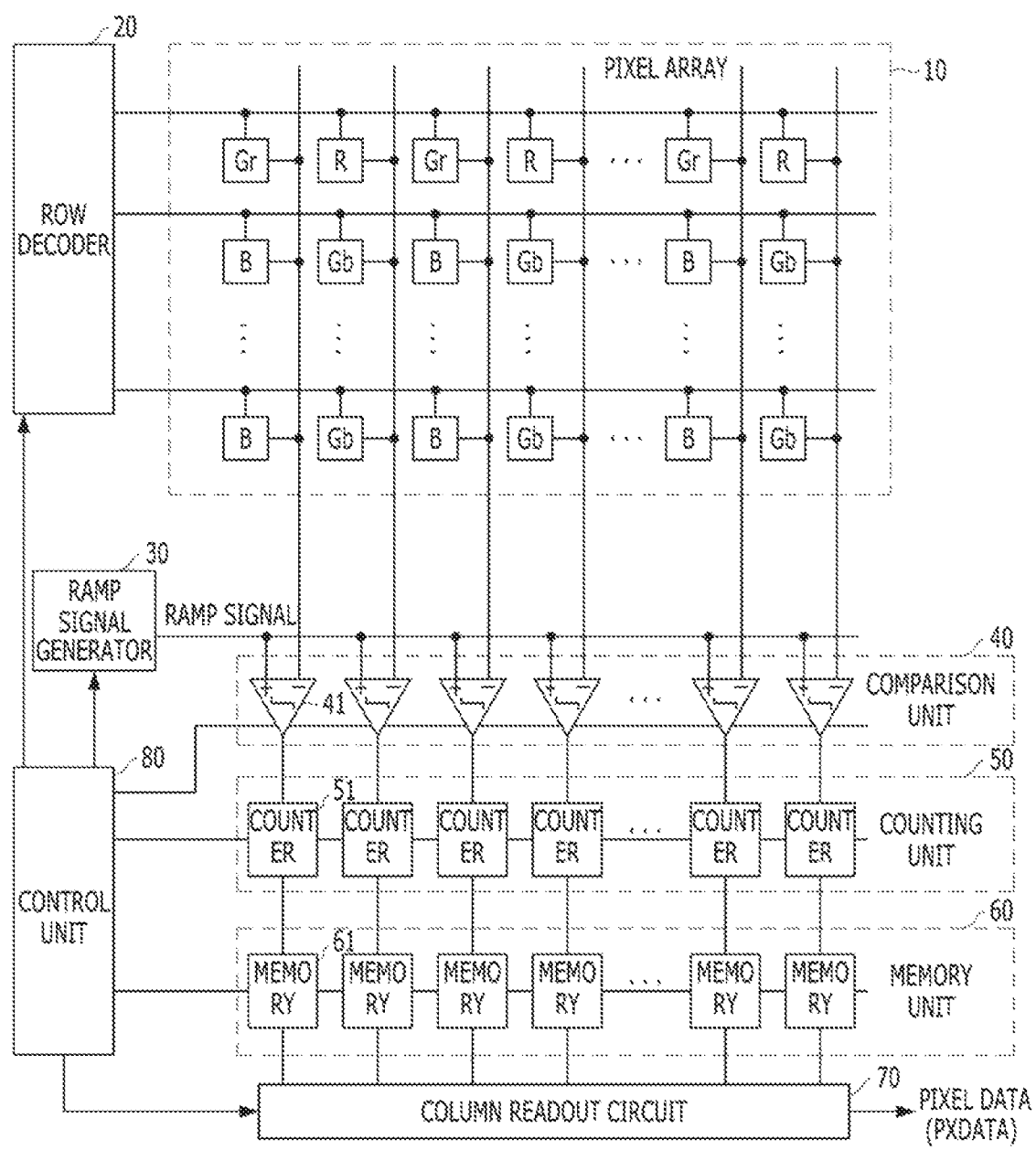
FIG. 1 is an example diagram of a CMOS image sensor for facilitating the understanding of the disclosed technology.

FIG. 1 is an example diagram of a CMOS image sensor (CIS) for facilitating the understanding of the disclosed technology, and illustrates a CMOS image sensor having a column parallel structure implemented using a general single slope analog-to-digital converter.

As illustrated in FIG. 1, the CMOS image sensor includes a pixel array 10 of photosensing pixels arranged in rows and columns to respond to incident light to output a pixel signal. Each photosensing pixel may be implemented by a photo diode, a photo transistor, a photo gate, or other photosensitive circuitry capable of converting light into a pixel signal (e.g., a charge, a voltage or a current). On top of the photosensing pixels, an array of different color filters are placed to cover the photosensing pixels to filter the incident light in different colors at different pixel locations to capture the color information in a sensed image. The specific example in FIG. 1 shows a pixel arrangement of colored imaging pixels labeled as "R" for a red colored pixel, "G" for a green colored pixel, and "B" for a blue colored pixel. The CMOS image sensor also includes a row decoder 20, a ramp signal generator 30, a comparison unit (comparison circuit) 40, a counting unit (counting circuit) 50, a memory unit (memory circuit) 60, a control unit (control circuit) 80, and a column readout circuit 70. The row decoder 20 selects pixels in the pixel array 10 according to row lines and controls operations of the pixels according to instructions provided by the control unit 80. The ramp signal generator 30 generates a ramp signal according to instructions provided by the control unit 80. The comparison unit 40 compares a value of the ramp signal applied from the ramp signal generator 30 with values of each pixel signal outputted from the pixel array 10 according to instructions provided by the control unit 80. The counting unit 50 counts the number of clock pulses of the control unit 80 according to each output signal of the comparison unit 40. The memory unit 60 stores counting information including the number of clock pulses provided by the counting unit 50 according to instructions provided by the control unit 80. The control unit 80 controls the operations of the row decoder 20, the ramp signal generator 30, the comparison unit 40, the counting unit 50, the memory unit 60, and the column readout circuit 70. The column readout circuit 70 sequentially outputs data stored in the memory unit 60 as pixel data PXDATA according to instructions provided by the control unit 80.

A CMOS image sensor may use the correlated double sampling (CDS) to remove an offset value of pixels by sampling a pixel signal twice so that the difference is taken between these two samples. In an embodiment of the disclosed technology, the correlated double sampling (CDS) may remove an offset value of pixels by comparing pixel signals (pixel output voltages) obtained before and after light is incident on the pixels with each other, so that only pixel signals based on the incident light can be actually measured. In an embodiment of the disclosed technology, the CDS may be conducted by the comparison unit 40.

The comparison unit 40 includes a plurality of comparators, the counting unit 50 includes a plurality of counters, and the memory unit 60 includes a plurality of memories. In an example configuration, each column of the pixel array 10 includes the comparators, the counters, and the memories.

Next, with reference to FIG. 1, operations of one comparator, one counter, and one memory will be described below as an example.

A first comparator 41 has two input terminals including one terminal that receives a pixel signal outputted from a first column of the pixel array 10, and the other terminal that receives a ramp signal applied from the ramp signal generator 30. The first comparator 41 compares values of the two signals (pixel signal and ramp signal) with each other according to a control signal of the control unit 80, and outputs a comparison signal.

Examples of the ramp signal $V_{RAMP}$ include a signal whose voltage level decreases or increases, a saw-tooth signal, and other types of reference signals. When the voltage of the ramp signal matches that of the pixel signal at a certain time point, values of comparison signals outputted from each comparator are inverted.

Accordingly, a first comparator 51 counts clock pulses provided by the control unit 80 until the comparison signal outputted from the comparator 41 is inverted from the time point at which the ramp signal starts to fall, and outputs counting information regarding the number of clock pulses counted by the first comparator 51. The respective counters are initialized according to a reset control signal from the control unit 80.

Then, a first memory 61 stores the counting information regarding the number of clock pulses counted by the first comparator 51 according to a load control signal of the control unit 80, and outputs the counting information to the column readout circuit 70.

In an example of the CMOS image sensor, counting is performed on a reset signal (a reset voltage) and then is performed on an image signal (a signal voltage).

Figure 2A:
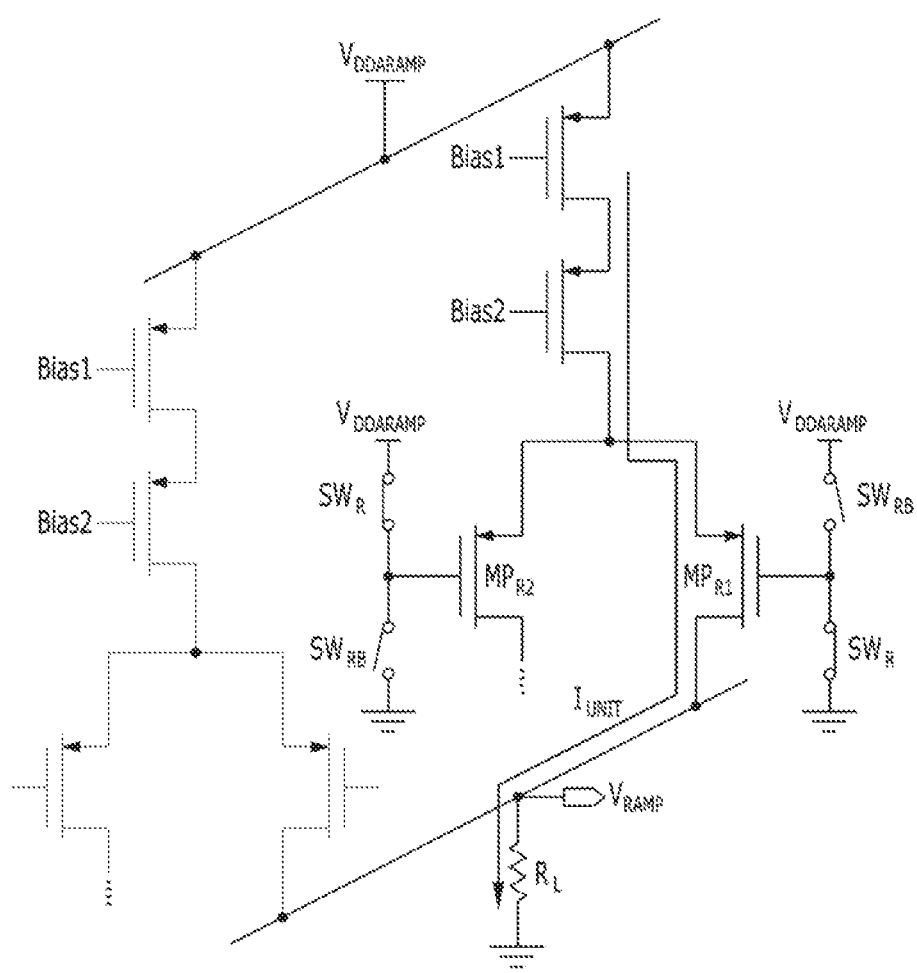
FIG. 2A and FIG. 2B are example diagrams of a ramp signal generator for facilitating the understanding of the disclosed technology.
Figure 2B:
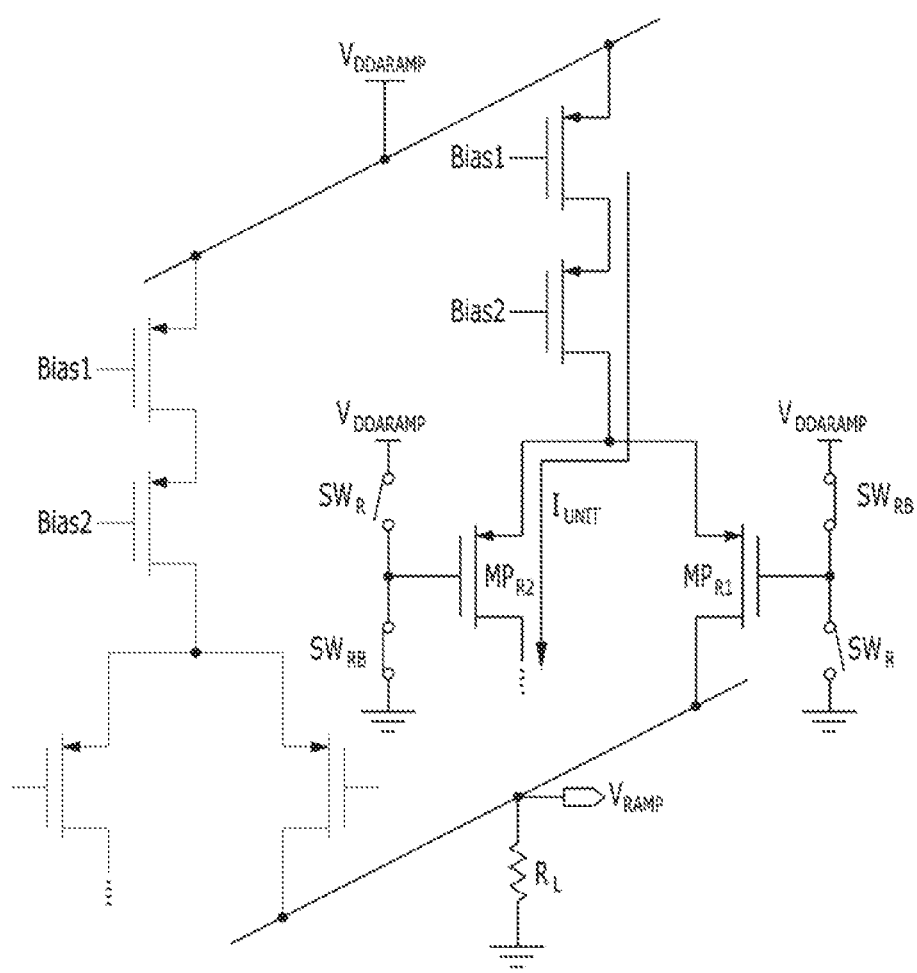

FIG. 2A and FIG. 2B are example diagrams of a ramp signal generator for facilitating the understanding of the disclosed technology.

As illustrated in FIG. 2A and FIG. 2B, the ramp signal generator includes a unit current cell array of unit current circuits or cells and a ramp resistor $R_L$, which is electrically connected to the unit current cell array in common. Here, since a technology for supplying a ramp supply voltage $V_{DDARAMP}$, a bias voltage and the like are well-known, a description thereof will be omitted. By sequentially turning on or off the unit current cells, a ramp voltage $V_{RAMP}$ is generated as expressed by Equation 1 below.

$$V_{RAMP}=I_{TOTAL}*R_L \quad \text{(Equation 1)}$$

In Equation 1 above, "$I_{TOTAL}$" denotes the total electric current flowing in all $I_{T\_OFF}$.

For example, in a setting where a ramp signal is generated such that the amplitude of the ramp signal has a negative slope by sequentially reducing the number of the unit current cells that allow the current to flow from a voltage supply terminal of a ramp supply voltage $V_{DDARAMP}$ to a ramp resistor $R_L$, an initial state of a ramp voltage is that a PMOS transistor $MP_{R2}$ stays "Off" (e.g., a switch $SW_{RB}$ stays off and a switch $SW_R$ stays on) so that currents can flow through all unit current cells or circuits (e.g., through all PMOS transistors MPR1) to the ramp resistor $R_L$ as illustrated in FIG. 2A. The switch $SW_{RB}$ and the switch $SW_R$ may be provided between the voltage supply terminal and a ground voltage terminal to be turned on or off in response to control signals provided by the control unit 80 of FIG. 1 or control signals provided by another controller (not illustrated) operating by receiving clock signals from the control unit 80 of FIG. 1. The switch $SW_{RB}$ and the switch $SW_R$ may be configured to control gate voltages of the PMOS transistor $MP_{R1}$ and the PMOS transistor $MP_{R2}$. As illustrated in FIG. 2B, after the initial state above the unit current cells or circuits start to change their current paths from the PMOS transistor $MP_{R1}$ to the PMOS transistor $MP_{R2}$. From the first unit current cell or circuit to the last current cell or circuit, the PMOS transistor $MP_{R1}$ is turned off and the PMOS transistor $MP_{R2}$ is turned on (the switch $SW_{RB}$ is turned on and the switch $SW_R$ is turned off), and the unit current circuits sequentially (one by one) allow the current to flow to the PMOS transistor $MP_{R2}$ instead of the PMOS transistor $MP_{R1}$. Here, the ramp voltage can be expressed by Equation 2 below.

$$V_{RAMP}=(I_{TOTAL}-I_{T\_off})*R_L \quad \text{(Equation 2)}$$

In Equation 2 above, "$I_{T\_off}$" denotes the amount of the current reduced from the total sum $I_{TOTAL}$ of current by changing the current paths of the unit current circuits from the PMOS transistor $MP_{R1}$ to the PMOS transistor $MP_{R2}$ such that the switch $SW_{RB}$ of the unit current circuit is switched from "off" to "on" and the switch $SW_R$ of the unit current circuit is switched from "on" to "off" as illustrated in FIG. 2A and FIG. 2B.

In another example, unlike the example shown in FIG. 2A and FIG. 2B, when the ramp signal has a positive slope, an initial state of a ramp voltage is that the PMOS transistor $MP_{R2}$ stays "on" so that the current of all the unit current circuits can initially flow through the PMOS transistor $MP_{R2}$. After the initial state, the unit current circuits start to change their current paths from the PMOS transistor $MP_{R2}$ to the PMOS transistor $MP_{R1}$. From the first unit current circuit to the last current circuit, the PMOS transistor $MP_{R1}$ is turned on, and the PMOS transistor $MP_{R2}$ is turned off, so that the unit current circuits sequentially (one by one) allow the current to flow to the PMOS transistor $MP_{R1}$ instead of the PMOS transistor $MP_{R2}$.

However, in the ramp signal generator illustrated in FIG. 2A and FIG. 2B, the linearity of the slope of the ramp signal may result in the occurrence of a code error when the code error rate exceeds the acceptable error rate (e.g., 1%) in the process of finding the position of a pixel signal with the ramp signal.

Unlike the ramp signal generator of FIG. 2A and FIG. 2B in which the step size of the unit current circuit is fixed, an embodiment of the disclosed technology makes it possible to adjust the step size by adjusting a current of a unit current circuit to adjust a slope of a ramp signal, which will be described in detail with reference to FIG. 3, FIG. 4, FIG. 5A and FIG. 5B, FIG. 6, and FIG. 7.

Figure 3:
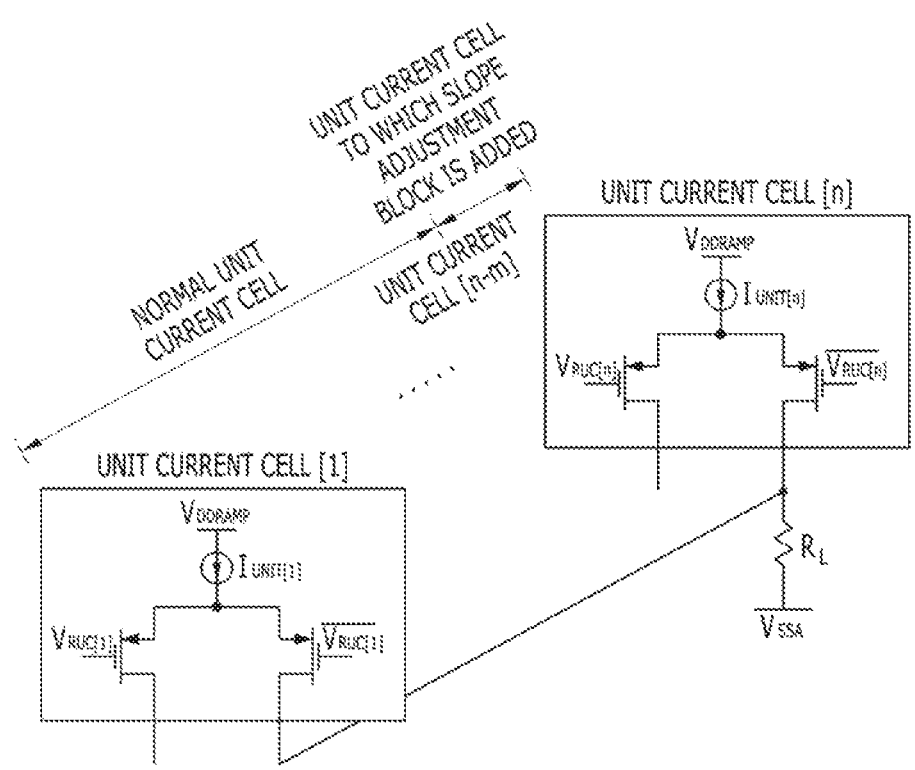
FIG. 3 is a diagram for explaining an example of a unit current cell array structure of a ramp signal generator based on an embodiment of the disclosed technology.

FIG. 3 is a diagram for explaining an example of a unit current cell array structure of a ramp signal generator based on an embodiment of the disclosed technology.

As illustrated in FIG. 3, among unit current cell arrays constituting the ramp signal generator, m (m is a natural number) normal unit current cell arrays corresponding to lower bits of a digital code use substantially the same structure as that of the ramp signal generator illustrated in FIG. 2A and FIG. 2B, and n-m (n is a natural number larger than m) normal unit current cell arrays corresponding to upper bits of the digital code use a unit current cell array to which a slope adjustment block (slope adjustment circuit; 420 of FIG. 4 to be described later) is added. Here, "n" denotes the number of all unit current circuits corresponding to the number of steps of the ramp signal generator, and is 1024 in the case of a ramp signal having a resolution of 10 bit. In an embodiment of the disclosed technology, an end portion of a ramp signal (a portion corresponding to the upper bits of the code) is adjusted by setting the number (n–m) of the unit current circuits to which the slope adjustment block (420 of FIG. 4 to be described later) is added, according to non-linearity requirement and the like. When the ramp signal generator operates, the unit current circuits are sequentially selected and driven according to timings of $V_{RUC}$ [n] and $V_{RUCB}$ [n].

Figure 4:
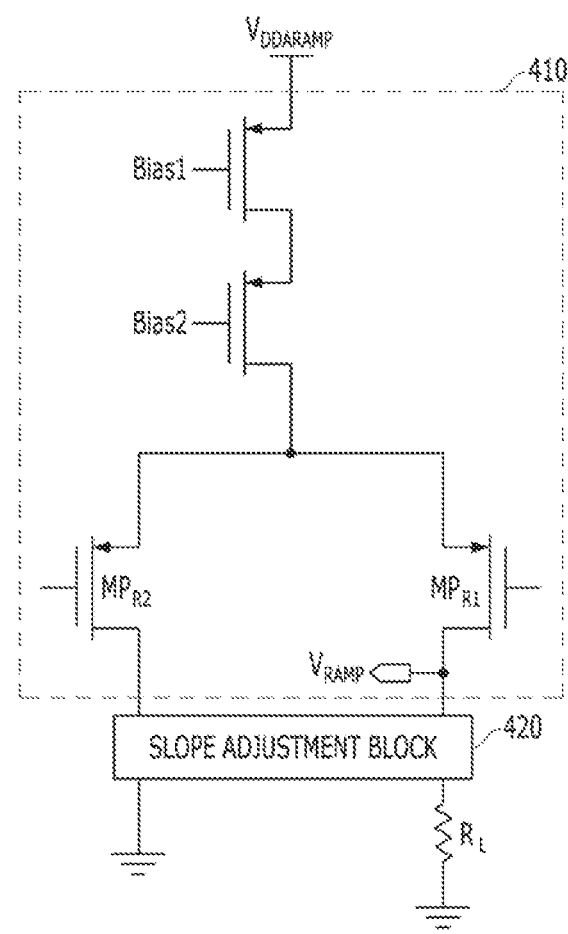
FIG. 4 is a configuration diagram of an example of a ramp signal generator based on an embodiment of the disclosed technology.

FIG. 4 is a configuration diagram of an example of a ramp signal generator based on an embodiment of the disclosed technology.

As illustrated in FIG. 4, the ramp signal generator based on an embodiment of the disclosed technology includes a unit current circuit 410, through which a current based on a ramp supply voltage $V_{DDARAMP}$ flows, and the slope adjustment block 420 for adjusting a slope of a ramp signal by adjusting the current flowing through the unit current circuit 410.

The slope adjustment block 420 adjusts the current flowing through the unit current circuit by using a current feedback path, thereby adjusting the slope of the ramp signal.

As described above, the ramp signal generator illustrated in FIG. 4 based on an embodiment of the disclosed technology includes the slope adjustment block 420 in the unit current circuit 410 to adjust the slope of the ramp signal, unlike the ramp signal generator of FIG. 2A and FIG. 2B. This will be described in detail with reference to FIG. 5A and FIG. 5B.

Figure 5A:
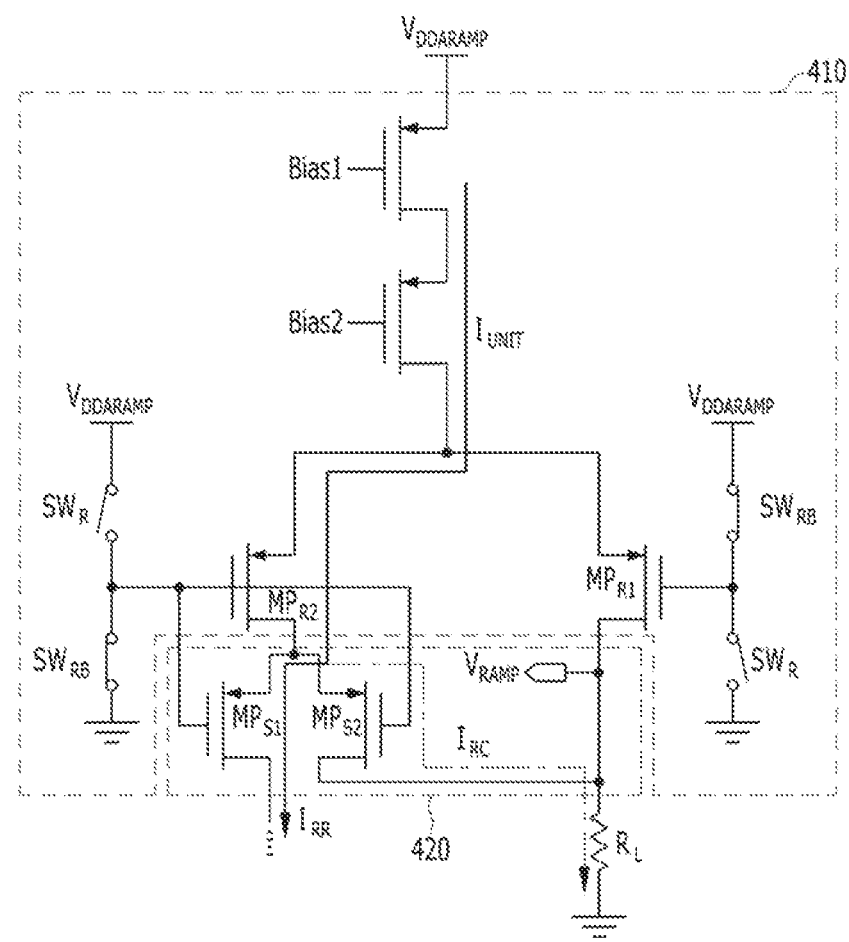
FIG. 5A and FIG. 5B are circuit diagrams of example ramp signal generators based on an embodiment of the disclosed technology.
Figure 5B:
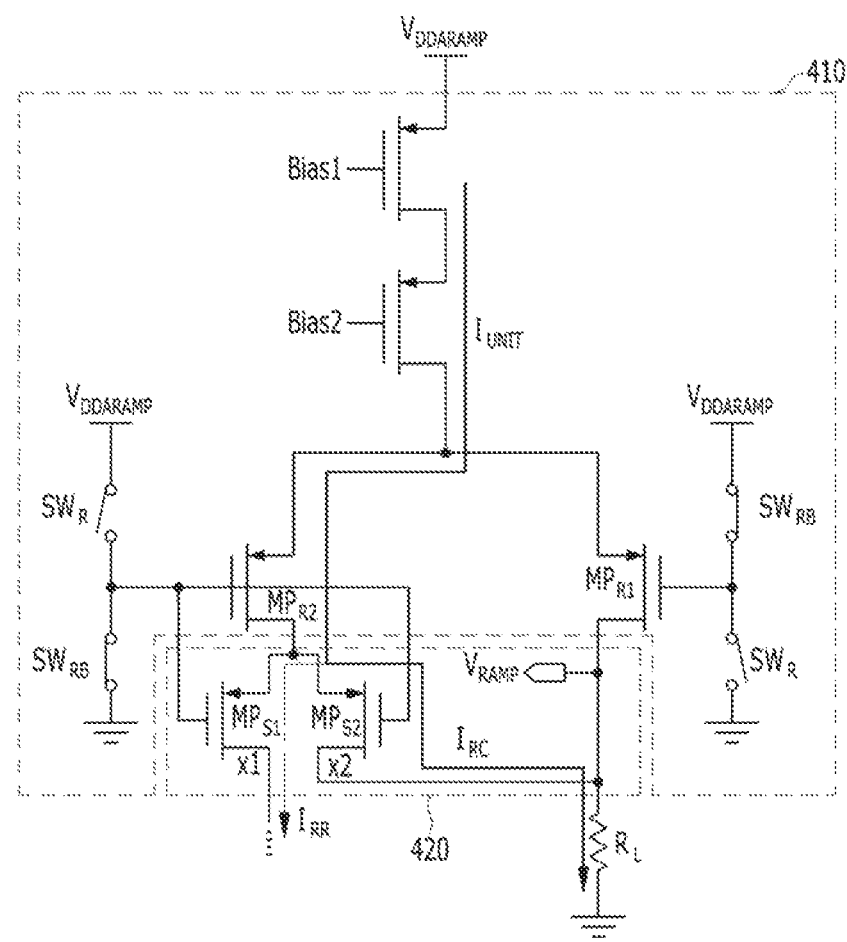
Figure 6:
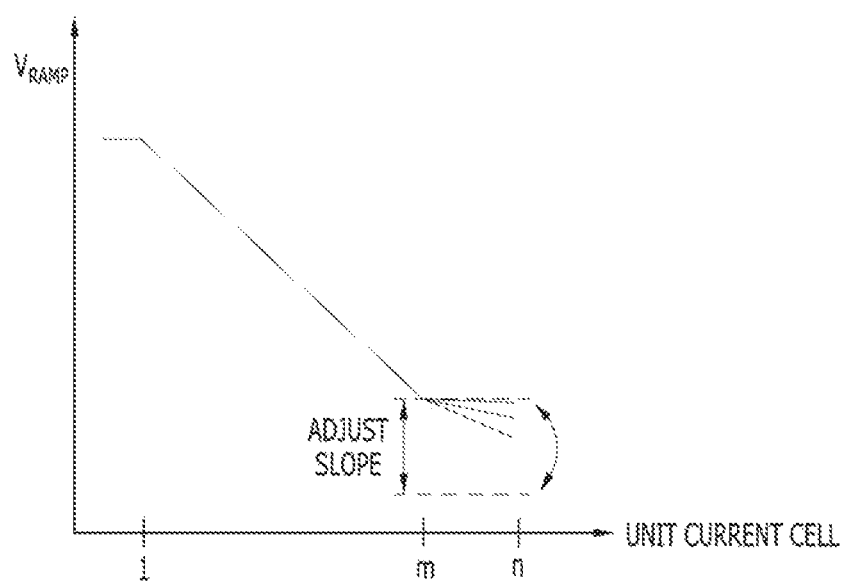
FIG. 6 is a diagram illustrating an example of a ramp voltage based on an embodiment of the disclosed technology.

FIG. 5A and FIG. 5B are circuit diagrams of example ramp signal generators based on an embodiment of the disclosed technology, and FIG. 6 is a diagram illustrating an example of a ramp voltage based on an embodiment of the disclosed technology.

As illustrated in FIG. 5A and FIG. 5B, the slope adjustment block 420 allows a current, which would have been wasted when the unit current circuit is turned off, to be fed back to a ramp resistor $R_L$ through a current feedback path, thereby adjusting the slope of the ramp signal.

To this end, the slope adjustment block 420 includes a PMOS transistor $MP_{S1}$, which forms a current path of wasting the current when the unit current circuit is turned off, and a PMOS transistor $MP_{S2}$, which forms the current feedback path of allowing the current to be fed back to the ramp resistor $R_L$ when the unit current circuit is turned off. The PMOS transistor $MP_{S2}$ forms the current feedback path of allowing the current of the PMOS transistor $MP_{S1}$, which would have been wasted had a current feedback path not been formed, to be fed back to the ramp resistor $R_L$ via the PMOS transistor $MP_{S2}$.

The PMOS transistor $MP_{S1}$ has a source terminal electrically connected to a drain terminal of the PMOS transistor $MP_{R2}$ of the unit current circuit 410, a gate terminal electrically connected between a switch $SW_{RB}$ and a switch $SW_R$ of the unit current circuit 410, and a drain terminal electrically connected to the ground voltage terminal.

The PMOS transistor $MP_{S2}$ has a source terminal electrically connected to the drain terminal of the PMOS transistor $MP_{R2}$ Of the unit current circuit 410, a gate terminal electrically connected between the switch $SW_{RB}$ and the switch $SW_R$ of the unit current circuit 410, and a source terminal electrically connected to the ramp resistor $R_L$.

In an example embodiment of the disclosed technology, the ramp signal may have a negative slope. Up to the $m^{th}$ unit current circuit, the PMOS transistors $MP_{R1}$ sequentially (one by one) allow the current to flow to the PMOS transistors $MP_{R2}$, thereby generating a ramp voltage as described in FIG. 2A and FIG. 2B. To put it another way, the PMOS transistors $MP_{R1}$ are sequentially turned off one by one up to the $m^{th}$ unit current circuit, the PMOS transistors $MP_{R2}$ are sequentially turned on one by one, and the currents flow through the PMOS transistors $MP_{R2}$, so that the ramp voltage is generated as expressed by Equation 2 above. Here, a current applied to the ramp resistor $R_L$ decreases, and a ramp voltage is sequentially reduced by the unit current circuits due to the reduction of the current, so that the ramp signal has a negative slope.

As described in FIG. 3, from the $(n-m)^{th}$ unit current circuit, the slope adjustment block 420 of FIG. 4 is added to the unit current circuit, and a predetermined amount of current is allowed to flow to the ramp resistor $R_L$ through the PMOS transistor $MP_{S2}$ as illustrated in FIG. 5A and FIG. 5B, so that the amount of $I_{UNIT}$, which is a current of $I_{T\_OFF}$, is adjusted to the amount of $I_{RC}$. In a case where the total current is defined as $I_{UNIT}(=I_{RC}+I_{RR})$, when the switch $SW_{RB}$ and the switch $SW_R$ of the unit current circuit are switched, the $I_{RC}$ is allowed to flow to the ramp resistor $R_L$ through the PMOS transistor $MP_{S2}$, and the $I_{RR}$ is allowed to flow to the ground voltage terminal through the PMOS transistor $MP_{R1}$.

Here, as illustrated in FIG. 5A and FIG. 5B, the amount of the current flowing to the ramp resistor $R_L$ through the PMOS transistor $MP_{S2}$ is associated with the slope of the ramp signal, and, as illustrated in FIG. 5B, the larger the amount of current as compared with FIG. 5A flows, the steeper the slope of the ramp signal. By so doing, a ramp voltage as expressed by Equation 3 below is generated as illustrated in FIG. 6. Here, it is possible to adjust the slope of the ramp voltage by $(I_{T(N-M)}-I_{RC})*R_L$.

$$V_{RAMP}=((I_{TM}-I_{T-OFF})+(I_{T(N-M)}-I_{RC}))*R_L \qquad \text{(Equation 3)}$$

In Equation 3 above, where the total amount of current flowing through the ramp resistor $R_L$ includes "$I_{TM}$" and "$I_{T(N-M)}$," "$I_{TM}$" denotes the total sum of currents of m unit current circuits, to which the slope adjustment block 420 is not added, and "$I_{T(N-M)}$" denotes the total sum of currents of (n–m) unit current circuits, to which the slope adjustment block 420 is added. In Equation 3, "$I_{RC}$" denotes the amount of feedback currents flowing to the ramp resistor $R_L$ through the PMOS transistor $MP_{R2}$ when the current that has been flowing through the PMOS transistor $MP_{R1}$ flows through the PMOS transistor $MP_{R2}$ when the switch $SW_{RB}$ of the unit current circuit is switched from "off" to "on" and the switch $SW_R$ of the unit current circuit is switched from "on" to "off." I other words, "$I_{RC}$" denotes the amount of currents adjusted through the slope adjustment block 420.

As apparent from FIG. 5A, FIG. 5B, and FIG. 6, various embodiments of the disclosed technology do not waste the ramp current by allowing the current that otherwise would have been wasted to flow to the ramp resistor $R_L$ through a separate current feedback path to adjust the slope of the ramp signal.

Figure 7:
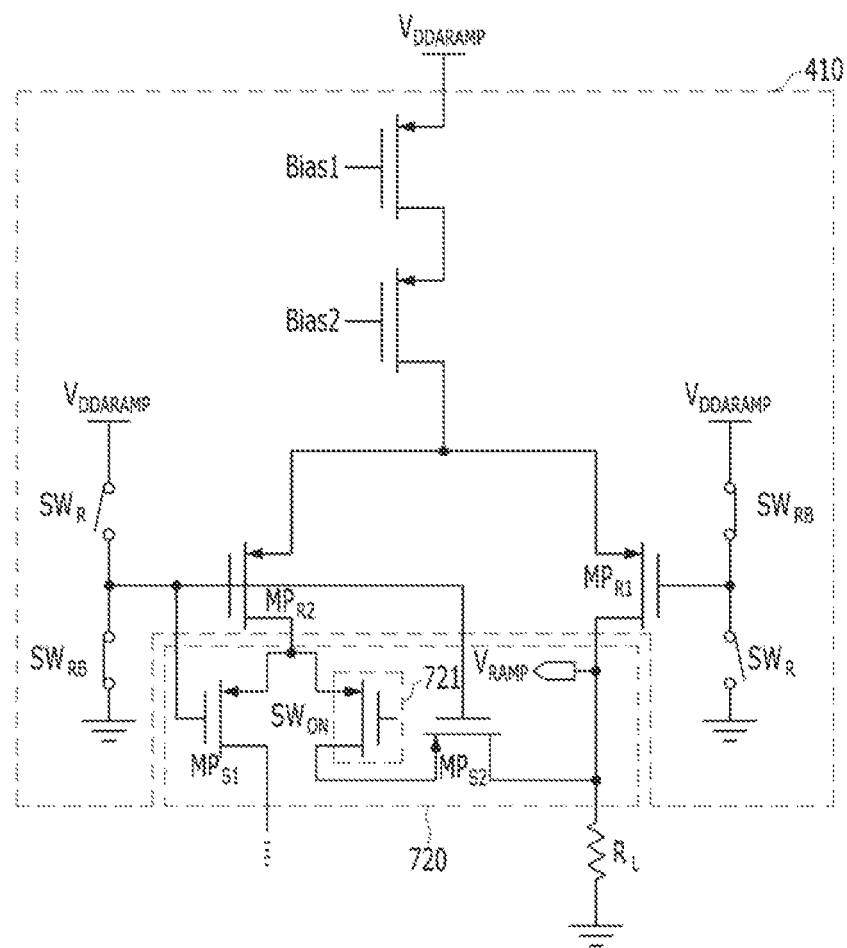
FIG. 7 is a circuit diagram illustrating another example ramp signal generator that further includes a switch based on an embodiment of the disclosed technology.

FIG. 7 is a circuit diagram illustrating another example ramp signal generator that further includes a switch based on an embodiment of the disclosed technology.

As illustrated in FIG. 7, a slope adjustment block 720 further includes a switch 721 for turning on or off a current feedback path of allowing a current to be fed back to the ramp resistor $R_L$, unlike the slope adjustment block 420 described in FIG. 5A and FIG. 5B.

The switch 721 may be implemented using a PMOS transistor provided between the drain terminal and the source terminal of the PMOS transistor $MP_{R2}$ of the unit current circuit 410. The PMOS transistor constituting the switch 721 may be turned on or off according to instructions provided by the control unit 80 of FIG. 1, or may be turned on or off according to instructions provided by a separate controller (not illustrated) operating by receiving the clock from the control unit 80 of FIG. 1.

Figure 8:
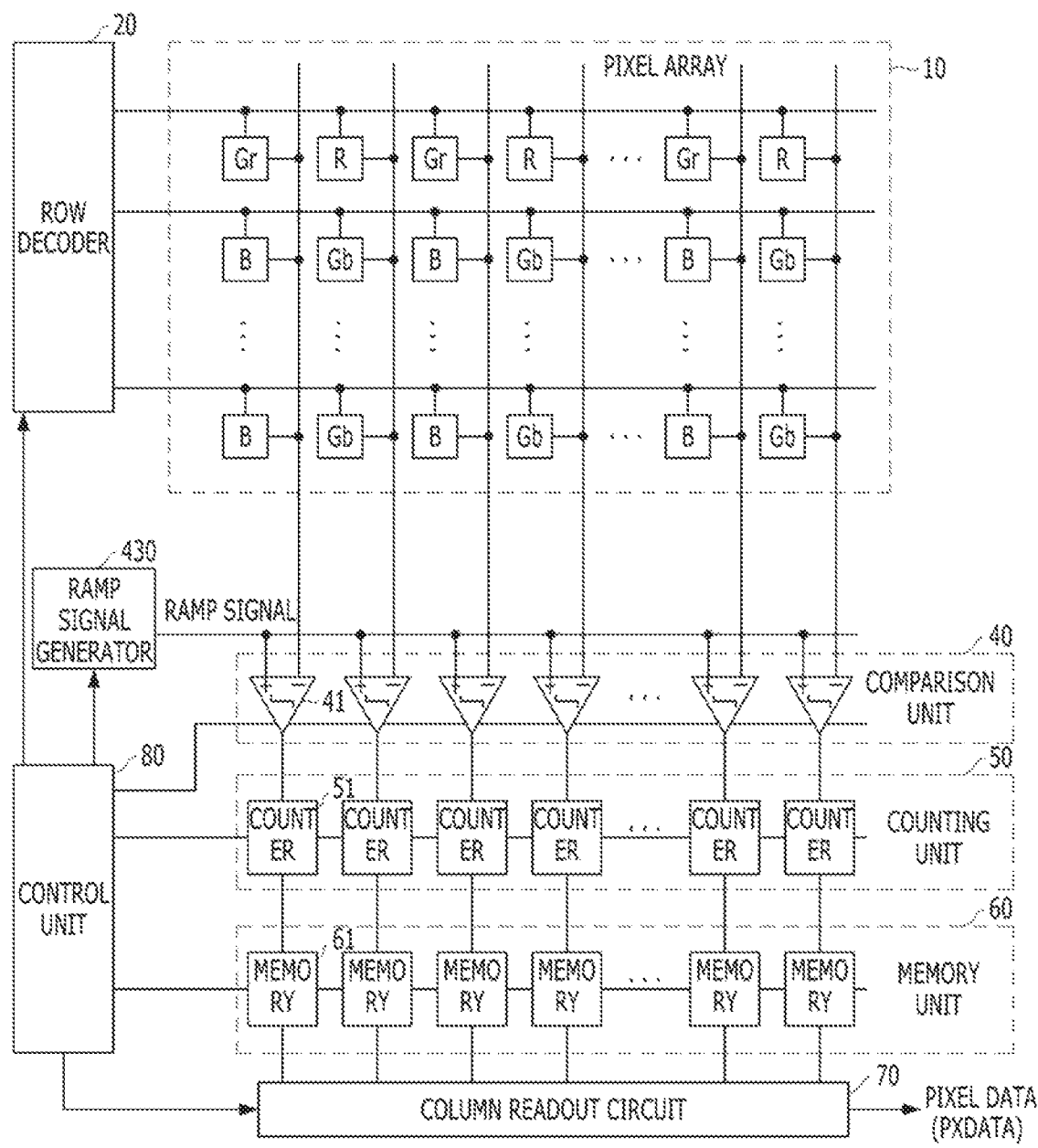
FIG. 8 is a configuration diagram of an example of a CMOS image sensor based on an embodiment of the disclosed technology.

FIG. 8 is a configuration diagram of an example of a CMOS image sensor based on an embodiment of the disclosed technology.

As illustrated in FIG. 8, the CMOS image sensor based on an embodiment of the disclosed technology includes a pixel array 10 for outputting a pixel signal corresponding to incident light, a row decoder 20, a ramp signal generator 430, a comparison unit 40, a counting unit 50, a memory unit 60, a control unit 80, and a column readout circuit 70. The row decoder 20 selects pixels in the pixel array 10 according to row lines and controls operations of the pixels under the control of the control unit 80. The ramp signal generator 430 generates a ramp signal under the control of the control unit 80. The comparison unit 40 compares a value of the ramp signal applied from the ramp signal generator 430 implemented based on various embodiments of the disclosed technology and the value of each pixel signal outputted from the pixel array 10 with each other according to instructions provided by the control unit 80. The counting unit 50 counts clock signals of the control unit 80 according to each output signal of the comparison unit 40. The memory unit 60 stores counting information of the counting unit 50 according to instructions provided by the control unit 80. The control unit 80 controls the operations of the row decoder 20, the ramp signal generator 430 implemented based on various embodiments of the disclosed technology, the comparison unit 40, the counting unit 50, the memory unit 60, and the column readout circuit 70. The column readout circuit 70 sequentially outputs data of the memory unit 60 as pixel data PXDATA according to instructions provided by the control unit 80. The ramp signal generator 430 based on an embodiment of the disclosed technology may be implemented like the ramp signal generator described with reference to FIG. 3, FIG. 4, FIG. 5A and FIG. 5B, FIG. 6, and FIG. 7.

In an embodiment of the disclosed technology, a ramp signal generator may include a plurality of unit current circuits and a plurality of slope adjustment circuit. The plurality of unit current circuits sequentially reduces a number of the unit current circuits that allow an electrical current to flow from a voltage supply terminal of the ramp signal generator to a ramp resistor to generate a ramp signal. Each unit current circuit includes a first current path that allows the electrical current to flow to the ramp resistor and a second current path that inhibits the electrical current from flowing to the ramp resistor. Each slope adjustment circuit is coupled to each unit current circuit, and includes a third current path that allows the electrical current to flow from the second current path to the ramp resistor to adjust a slope of the ramp signal by adjusting the electrical current flowing to the ramp resistor. Each slope adjustment circuit may further include a switch coupled between the third current path and the ramp resistor to connect or disconnect the third current path to the ramp resistor.

Although various embodiments and specific examples have been described, various changes and modifications may be made based on what is described and illustrated.

What is claimed is:

1. A device including a ramp signal generator which comprises:
   a unit current circuit including one or more current paths that allow a flow of an electrical current generated based on a ramp supply voltage; and
   a slope adjustment circuit configured to adjust a slope of a ramp signal by changing a current path of the electrical current flowing through the one or more current paths of the unit current circuit, wherein the slope adjustment circuit includes a current feedback path that changes the flow of the electrical current from one current path to another current path to adjust the current flowing through the unit current circuit.

2. The device of claim 1, wherein the slope adjustment circuit allows a current, which would have been wasted when the unit current circuit is turned off had the current feedback path not been formed, to be fed back to a ramp resistor through the current feedback path.

3. The device of claim 2, wherein the slope adjustment circuit comprises:
   a first transistor configured to form a current path of wasting the current when the unit current circuit is turned off; and
   a second transistor configured to form the current feedback path of allowing the current to be fed back to the ramp resistor when the unit current circuit is turned off.

4. The device of claim 3, wherein the first transistor has a source terminal electrically connected to the unit current circuit, and a drain terminal electrically connected to a ground voltage.

5. The device of claim 3, wherein the second transistor has a source terminal electrically connected to the unit current circuit, and a drain terminal electrically connected to the ramp resistor.

6. The device of claim 3, wherein the slope adjustment circuit further comprises:
   a switch coupled to the second transistors to turn on or off the current feedback path.

7. The device of claim 6, wherein the switch comprises:
   a third transistor provided between the unit current circuit and the source terminal of the second transistor.

8. The device of claim 1, wherein the slope adjustment circuit is provided in the unit current circuit.

9. A device including a CMOS image sensor which comprises:
   a pixel array configured to output pixel signals corresponding to incident light;
   a row decoder configured to select and control pixels in the pixel array according to row lines;
   a ramp signal generator including one or more unit current circuits coupled to a current feedback path, the ramp signal generator being configured to adjust a current flowing through at least one of the one or more unit current circuits by using the current feedback path to adjust a slope of a ramp signal;

a comparison circuit configured to compare the ramp signal applied from the ramp signal generator with each pixel signal of the pixel array;

a counting circuit configured to count the number of clock pulses according to each output signal of the comparison circuit;

a memory circuit configured to store counting information of the counting unit including the number of clock pulses provided by the counting unit;

a control circuit configured to control operations of the row decoder, the ramp signal generator, the comparison unit, the counting unit, and the memory unit; and a column readout circuit configured to output data stored in the memory unit according to instructions provided by the control unit.

10. The device of claim 9, wherein the ramp signal generator comprises:

the at least one unit current circuit including one or more current paths that allow a flow of an electrical current generated based on a ramp supply voltage; and a slope adjustment circuit configured to adjust a slope of the ramp signal by changing a current path of the electrical current flowing through the one or more current paths of the at least one unit current circuit to the current feedback path.

11. The device of claim 10, wherein the slope adjustment circuit allows a current, which would have been wasted when the at least one unit current circuit is turned off had the current feedback path not been formed, to be fed back to a ramp resistor through the current feedback path to adjust the slope of the ramp signal.

12. The device of claim 11, wherein the slope adjustment circuit comprises:

a first transistor configured to form a current path of wasting the current when the at least one unit current circuit is turned off; and a second transistor configured to form the current feedback path of allowing the current to be fed back to the ramp resistor when the at least one unit current circuit is turned off.

13. The device of claim 12, wherein the first transistor has a source terminal electrically connected to the at least one unit current circuit, and a drain terminal electrically connected to a ground voltage.

14. The device of claim 12, wherein the second transistor has a source terminal electrically connected to the at least one unit current circuit, and a drain terminal electrically connected to the ramp resistor.

15. The device of claim 12, wherein the slope adjustment circuit further comprises:

a switch coupled to the second transistors to turn on or off the current feedback path.

16. The device of claim 15, wherein the switch comprises:

a third transistor provided between the at least one unit current circuit and the source terminal of the second transistor.

17. The device of claim 10, wherein the slope adjustment circuit is provided in the at least one unit current circuit.

18. A device including a ramp signal generator which comprises:

a plurality of unit current circuits that sequentially reduces a number of the unit current circuits that allow an electrical current to flow from a voltage supply terminal of the ramp signal generator to a ramp resistor to generate a ramp signal, each unit current circuit including a first current path that allows the electrical current to flow to the ramp resistor and a second current path that inhibits the electrical current from flowing to the ramp resistor; and a plurality of slope adjustment circuits, each slope adjustment circuit being coupled to each unit current circuit, each slope adjustment circuit including a third current path that allows the electrical current to flow from the second current path to the ramp resistor to adjust a slope of the ramp signal by adjusting the electrical current flowing to the ramp resistor.

19. The device of claim 18, wherein each slope adjustment circuit further includes a switch coupled between the third current path and the ramp resistor to connect or disconnect the third current path to the ramp resistor.

20. The device of claim 18, wherein the third current path allows the electrical current to flow from the second current path to the ramp resistor when the plurality of unit current circuits is turned off.

* * * * *